United States Patent [19]

Simmons et al.

[11] Patent Number: 4,943,708

[45] Date of Patent: Jul. 24, 1990

[54] DATA DEVICE MODULE HAVING LOCKING GROOVE

[75] Inventors: Marion I. Simmons, Tempe; Harry J. Geyer, Phoenix, both of Ariz.

[73] Assignee: Motorola, Inc., Schaumburg, Ill.

[21] Appl. No.: 150,811

[22] Filed: Feb. 1, 1988

[51] Int. Cl.$^5$ ............................................. G06K 19/06
[52] U.S. Cl. ................................. 235/492; 235/488; 361/395
[58] Field of Search ............... 235/492, 488; 361/395

[56] References Cited

U.S. PATENT DOCUMENTS

| | | |
|---|---|---|
| 4,167,605 | 10/1986 | Obrecht et al. |
| 4,448,630 | 5/1984 | Blanquart . |
| 4,463,971 | 8/1984 | Hoppe et al. ................. 235/492 X |
| 4,523,297 | 6/1985 | Ugon et al. . |
| 4,544,833 | 10/1985 | Ugon . |
| 4,841,134 | 6/1989 | Hida et al. ................... 235/492 X |

OTHER PUBLICATIONS

Stephen B. Weinstein; "Smart Credit Cards: the Answer to Cashless Shopping", *IEEE Spectrum*, Feb. 1984, pp. 41–49.

"Does Catalyst Have The Key To Smart Cards"; *Electronics*, Dec. 18, 1986, pp. 59–62.

Clifford Barney; "Smart Card; Will It Create A Billion-Dollar IC Business?"; *Electronics*, Dec. 18, 1986, pp. 55–58.

Drefus & Levin; "Videotex & Smart Cards"; *Proceedings Videotex International*, 1984, 5 pages.

*Primary Examiner*—David L. Trafton
*Attorney, Agent, or Firm*—Joe E. Barbee

[57] ABSTRACT

A module is described for use in data devices such as smart cards. The module consists of a contact carrier having contacts, an integrated circuit, and a base enclosing the integrated circuit. The base is formed to provide a groove around the perimeter such that when the device is formed, material from an intermediate layer will flow into the groove and secure the module to the card.

14 Claims, 2 Drawing Sheets

DATA DEVICE MODULE HAVING LOCKING GROOVE

BACKGROUND OF THE INVENTION

The present invention relates, in general, to data devices and, more particularly, to integrated circuit modules for data devices.

One type of commonly known data device is the smart card. This is a credit card that contains an integrated circuit to store information on items such as financial or medical data. Examples of smart cards and how they are produced can be seen in U.S. Pat. No. 4,617,216.

A problem with the present designs of data devices is that the module has a tendency to come out of the card easily. This is not only inconvenient for the card owner, but also makes it easier for the module to be reverse engineered for illicit purposes.

Accordingly, it is an object of the present invention to provide a data device module that overcomes the above deficiencies.

A further object of the present invention is to provide a data device module that is secure.

Another object of the present invention is to provide a data device module that is compatible with existing manufacturing techniques.

The above and other objects and advantages of the present invention are provided by the data device module described herein.

SUMMARY OF THE INVENTION

A particular embodiment of the present invention consists of a data device module comprising; contacts, a contact carrier, an integrated circuit, and a molded package. The molded package being shaped to provide a locking means, such as a groove, into which an intermediate layer of card material will flow.

DETAILED DESCRIPTION OF THE DRAWINGS

Figure 1:
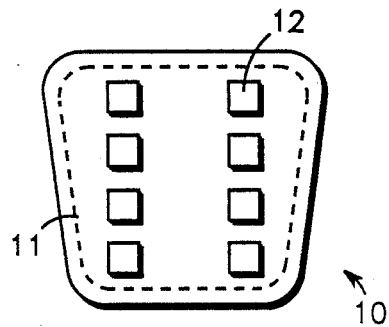
FIG. 1 is a top view of a data device module embodying the present invention.
Figure 2:
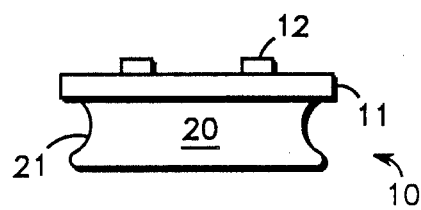
FIG. 2 is a side view of the data device module of FIG. 1.

Referring first to FIGS. 1 and 2, a data device module, generally designated 10, is illustrated. Module 10 consists of a contact carrier 11 having a plurality of contacts 12 disposed thereon. The bottom of contact carrier 11 is illustrated in FIGS. 5 and 6.

Figure 5:
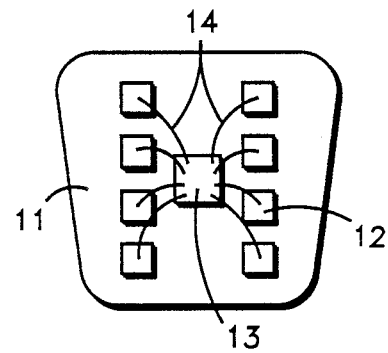
FIG. 5 is a bottom view a contact carrier embodying the present invention.

In FIG. 5, a contact arrangement is shown that permits wire or tape automated bonding of a die 13 to contacts 12. As illustrated, contacts 12 extend through contact carrier 11 and are exposed on the bottom portion. Die 13 is attached to contact carrier 11 utilizing a die attach material. Die 13 is then electrically coupled to contacts 12 with wire bonds 14.

Figure 6:
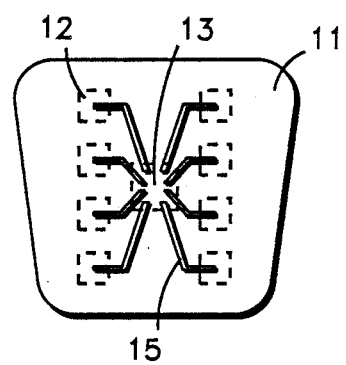
FIG. 6 is a bottom view of a second contact carrier embodying the present invention.

In FIG. 6, a contact arrangement is shown that permits flip chip bonding of die 13 to contacts 12. Die 13 is bonded to conductive lines 15 which are disposed on the bottom of carrier 11 and coupled to contacts 12.

Once die 13 has been coupled to contact carrier 11, a base 20 is molded about the bottom of contact carrier 11. As is shown, base 20 is shaped having a locking means 21. In this case, the locking means is a groove in the side wall of base 20. As will be seen below, this allows module 10 to be secured into the data device.

Figure 3:
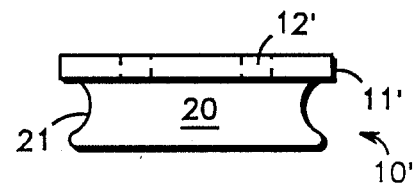
FIG. 3 is a side view of a second data device module embodying the present invention.

In FIG. 2, module 10 has contacts 12 extending above the surface of carrier 11. This will enable direct access to contacts 12 when the device is completed. In FIG. 3, a second module 10' having an alternative type of contact carrier 11' is illustrated. In carrier 11', contacts 12' are disposed even with the surface. It should be noted that contacts 12' could also be disposed below the surface. This leaves contacts 12' disposed below the surface of the completed card. Those types of contacts utilize capacitive electrical connections to communicate with external devices.

Figure 4:
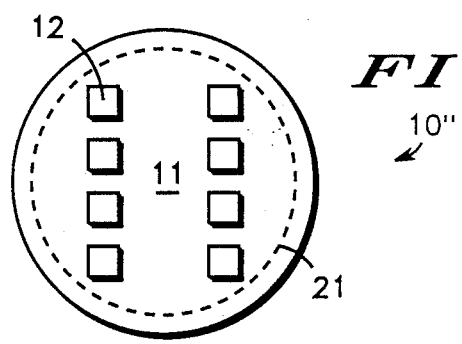
FIG. 4 is a top view of a third data device module embodying the present invention.
Figure 7:
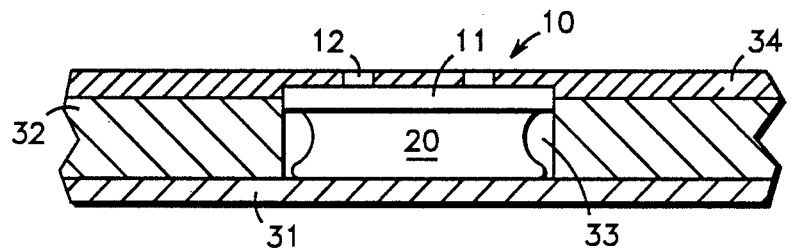
FIGS. 7 and 8 are partial cross sectional views of the data device module of FIG. 1 being incorporated in a data device.

As illustrated in FIG. 1, module 10 is in the shape of a trapezoid having rounded corners. This design was utilized to provide easy registration but is not required. Module 10 can come in several shapes. In FIG. 4, module 10" is shown as a circle having contacts 12 on a contact carrier 11. Locking means 21 of the base portion 20 is illustrated by the dashed line.

Figure 8:
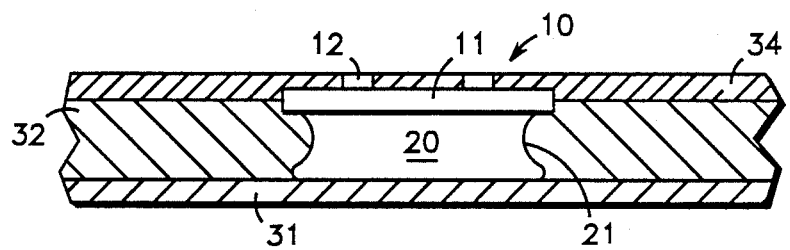
Figure 9:
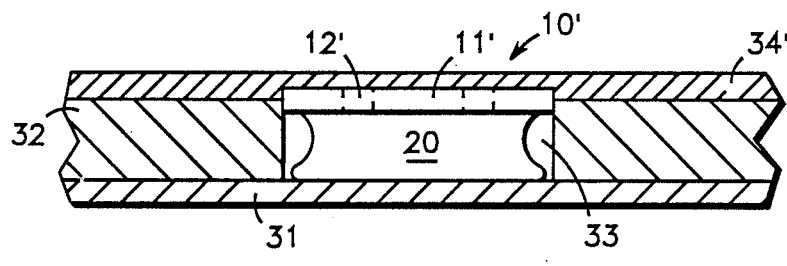
FIGS. 9 and 10 are partial cross sectional views of the data device module of FIG. 3 being incorporated in a data device.

Referring now to FIGS. 7–10, the production of data devices 30 and 30' are illustrated using modules 10 and 10' respectively. It should be noted that these types of devices may be items such as smart cards, military dog tags, medical alert bracelets, jewelry, keys, etc. First, a bottom laminate 31 is placed down as a base. Following this, an intermediate layer 32 having openings 33 disposed therein is placed on base laminate 31. Openings 33 are cut to be approximately the same size as module 10 or 10'. Module 10 or 10' is then placed in opening 33 and a top laminate 34 or 34' is placed on top. For data device 30, top laminate 34 has openings disposed therein to allow contacts 12 to be exposed to the surface. In FIG. 9, top laminate 34' does not have openings since contacts 12' do not require direct contact.

Figure 10:
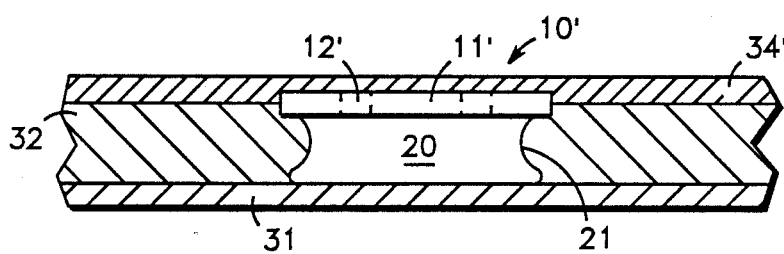

Once the various layers are in place, data devices 30 and 30' are exposed to heat and pressure to form the final card. One method of providing this heat and pressure forming method is described in U.S. Pat. No. 4,448,630 entitled "Machine for Applying a Film". As illustrated in FIGS. 8 and 10, intermediate layer 32 is softened so that it will flow into locking means 21 of modules 10 and 10'.

When cured this provides a secure data device. In order to remove module 10, device 30 would have to be destroyed. In addition, materials can be selected for layers 31, 32, and 34 such that they are stronger than base 20. This will result in module 10 being destroyed if an attempt is made to remove it from device 30.

Figure 11:
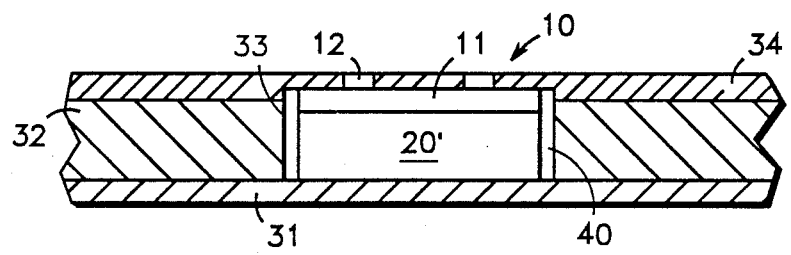

Another embodiment of the present invention is illustrated in FIG. 11. Here, a module 30" is illustrated having a module 10 disposed in opening 33 of intermediate layer 32. Disposed about module 10 is an adhesive 40. Adhesive 40 acts to form a bond between layer 32 and module 10. The bond being preferably stronger than module 10 or layer 32. Top laminate 34 is then set down as in the previous example. As shown in FIG. 11, module 10 has a straight wall along base 20. However, it should be noted that this does not require a straight wall and may be any design.

Thus, it will be apparent to one skilled in the art that there has been provided in accordance with the invention, a device that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A data device module comprising:
   a contact carrier having a first surface and a second surface opposite said first surface;
   an integrated circuit coupled to said second surface of said contact carrier;
   contact means for providing contact between said integrated circuit and a device external to said data device module, said contact means being coupled to said integrated circuit and at least partially disposed in said contact carrier;
   a base having a side wall and being coupled to said second surface of said contact carrier and disposed about said integrated circuit; and
   locking means for securing said data device module to a data device, said locking means being disposed about said side wall of said base, wherein said locking means comprises a groove disposed in said side wall of said base.

2. The data device module of claim 1 wherein said contact means comprises:
   a contact pad disposed in said contact carrier; and
   a bonding wire extending from said integrated circuit to said contact pad.

3. The data device module of claim 2 wherein said contact pad extends from said second surface to said first surface of said contact carrier.

4. The data device module of claim 1 wherein said contact means comprises:
   a contact pad disposed in said contact carrier; and
   a conductive line disposed on said second surface of said contact carrier for coupling said integrated circuit to said contact pad.

5. The data device module of claim 4 wherein said contact pad extends from said second surface to said first surface of said contact carrier.

6. A data device comprising:
   a bottom layer having a first surface;
   an intermediate layer having a first surface, a second surface and a wall defining an opening extending from said first surface to said second surface, said second surface of said intermediate layer being coupled to said first surface of said bottom layer;
   a module being disposed in the opening defined by said wall of said intermediate layer, said module having:
      a contact carrier having a first surface and a second surface opposite said first surface;
      an integrated circuit coupled to said second surface of said contact carrier;
      contact means for providing contact between said integrated circuit and a device external to said data device, said contact means being coupled to said integrated circuit and at least partially disposed in said contact carrier;
      a base having a side wall, being coupled to said second surface of said contact carrier, and disposed about said integrated circuit; and
      locking means for securing said data device module to a data device, said locking means being disposed about said side wall of said base, wherein said locking means comprises a groove disposed in said side wall of said base; and
   a top layer having a second surface coupled to said first surface of said intermediate layer.

7. The data device of claim 6 wherein said contact means comprises:
   a contact pad disposed in said contact carrier; and
   a bonding wire extending from said integrated circuit to said contact pad.

8. The data device of claim 7 wherein said contact pad extends from said second surface to said first surface of said contact carrier.

9. The data device of claim 6 wherein said contact means comprises:
   a contact pad disposed in said contact carrier; and
   a conductive line disposed on said second surface of said contact carrier for coupling said integrated circuit to said contact pad.

10. The data device of claim 9 wherein said contact pad extends from said second surface to said first surface of said contact carrier.

11. The data device of claim 6 wherein said locking means comprises an adhesive disposed between said side wall of said base and said wall defining the opening in said intermediate layer.

12. The data device of claim 6 wherein a wall of said top layer defines an opening therethrough such that said contact means extends into the opening.

13. A data device comprising:
   a bottom layer having a first surface;
   an intermediate layer having a first surface, a second surface, and a wall defining an opening extending from said first surface to said second surface, said second surface of said intermediate layer being coupled to said first surface of said bottom layer;
   a module being disposed in the opening defined by said wall of said intermediate layer, said module having:
      a contact carrier having a first surface and a second surface opposite said first surface;
      an integrated circuit coupled to said second surface of said contact carrier;
      a contact pad disposed in said contact carrier;
      a bonding means for coupling said contact pad to said integrated circuit;
      a base having a side wall, being coupled to said second surface of said contact carrier, and disposed about said integrated circuit, said side wall defining a groove therein for coupling to said intermediate layer; and
   a top layer having a second surface coupled to said first surface of said intermediate layer.

14. The data device of claim 13 wherein a wall of said top layer defines an opening therethrough such that said contact means extends into the opening.

* * * * *